United States Patent [19]
Huang

[11] Patent Number: 5,245,213
[45] Date of Patent: Sep. 14, 1993

[54] PLANARIZED SEMICONDUCTOR PRODUCT

[75] Inventor: Kuei-Wu Huang, Irving, Tex.

[73] Assignee: SGS-Thomson Microelectronics, Inc., Carrollton, Tex.

[21] Appl. No.: 774,209

[22] Filed: Oct. 10, 1991

[51] Int. Cl.$^5$ .............................. H01L 21/88
[52] U.S. Cl. .................. 257/638; 437/228; 257/641; 257/644; 257/646; 257/650
[58] Field of Search ............... 357/68, 71, 67; 437/228

[56] References Cited

U.S. PATENT DOCUMENTS

| | | | |
|---|---|---|---|
| 4,508,815 | 4/1985 | Ackmann et al. | 357/65 |
| 4,676,868 | 6/1987 | Riley et al. | 357/71 |
| 4,826,786 | 5/1989 | Merenda et al. | 437/231 |
| 4,962,063 | 10/1990 | Maydan et al. | 437/228 |
| 4,965,226 | 10/1990 | Gootzen et al. | 357/71 |

FOREIGN PATENT DOCUMENTS

| | | | |
|---|---|---|---|
| 60-49649 | 3/1985 | Japan | . |
| 63-131546 | 6/1988 | Japan | . |
| 63-196063 | 8/1988 | Japan | . |
| 63-302537 | 12/1988 | Japan | . |
| 1-248537 | 10/1989 | Japan | . |
| 2-254741 | 10/1990 | Japan | 437/228 |

*Primary Examiner*—Eugene R. LaRoche
*Assistant Examiner*—Viet Q. Nguyen
*Attorney, Agent, or Firm*—Richard A. Bachand; Lisa K. Jorgenson; Richard K. Robinson

[57] ABSTRACT

An integrated circuit structure is presented that includes a substrate in which integrated circuit elements are constructed, a first interconnection metalization over the substrate interconnecting selected ones of the integrated circuit elements, and an oxide layer over the substrate and the first metal interconnection pattern. A glass layer over the oxide layer is substantially planar between portions that overlie the metalization and portions that do not over lie the metalization.

4 Claims, 1 Drawing Sheet

PLANARIZED SEMICONDUCTOR PRODUCT

BACKGROUND OF THE INVENTION

1. FIELD OF THE INVENTION

This invention relates to improvements in semiconductor fabrication processes, and more particularly to improvements in semiconductor planarization processes, and to semiconductor products utilizing the improved planarization process of the invention.

2. DESCRIPTION OF THE PRIOR ART

In the fabrication of integrated circuits in many instances it is desired to provide a planarized surface, that is, a top surface for the integrated circuit that has relatively even or smooth topography. In typical manufacturing processes, a structure is made including patterned metal conductors formed on a stack of underlying structures and covered with a low temperature oxide, such as a plasma-enhanced oxide. The oxide is then covered with an insulating layer such as spin-on glass (SOG). The plasma-enhanced oxide is relatively conformal; consequently, it will have fairly significant hills overlying the regions of the stack of underlying structure on which metal has been deposited and patterned and steep valleys formed in-between. To planarize these hills and valleys, the spin-on glass is applied and etched back to attempt to achieve a smooth surface on the integrated circuit. However, as the spin-on glass is etched through in the regions overlying the metal, oxygen free radicals are released from the plasma-enhanced oxide which enhances the etch rate of the spin-on glass in the valley regions of the integrated circuit. The etch rate of the spin-on glass, for example, can be 50% or higher than that of the plasma-enhanced oxide, depending on the etch chemistry; thus, the planarization of the integrated circuit involves critical process parameters that are difficult to control, especially when an etch into the underlying plasma-enhanced oxide is required.

SUMMARY OF THE INVENTION

In light of the above, it is, therefore, an object of the invention to provide an improved process for planarizing the surface of an integrated circuit on which spin-on glass or the like has been applied.

It is another object of the invention to provide a method of the type described in which the etch rate of spin-on glass is not as critical a process parameter as heretofore.

It is another object of the invention to provide a method of the type described which can be used to enhance the yield and reliability for integrated circuits having multilevel metalization.

It is another object of the invention to provide a method of the type described which does not require complete design of additional masks and does not unduly complicate the integrated circuit process flow.

These and other objects, features, and advantages will become apparent to those skilled in the art from the following detailed description when read in conjunction with the accompanying drawing and appended claims.

In accordance with a broad aspect of the invention, a method for planarizing an integrated circuit structure having a glass layer overlying an oxide layer of an integrated circuit is presented. The method includes the steps of selectively etching portions of the glass structure that overlie portions of the oxide layer that have higher elevations than other portions of the oxide layer, and then etching the glass layer overall. The etching step includes forming a layer of photoresist over the glass layer, exposing selected areas of the photoresist over the portions of the oxide layer that have higher elevations than other portions of the oxide layer, removing the exposed areas of the photoresist, and etching the glass layer within the removed areas of the photoresist. The mask used in patterning the photoresist can be the same mask, or its negative, that is used in forming the metalization layer over which the oxide and glass layers have been formed.

In accordance with another broad aspect of the invention, an integrated circuit structure is presented including a substrate on which integrated circuit elements are constructed, a first interconnection metalization over the substrate interconnecting selected ones of the integrated circuit elements, and an oxide layer over the substrate and the first metal interconnection pattern. A glass layer over the oxide layer is substantially planar between portions that overlie the metalization and portions that do not over lie the metalization.

BRIEF DESCRIPTION OF THE DRAWING

The invention is illustrated in the accompanying drawing in which.

Figure 1A:
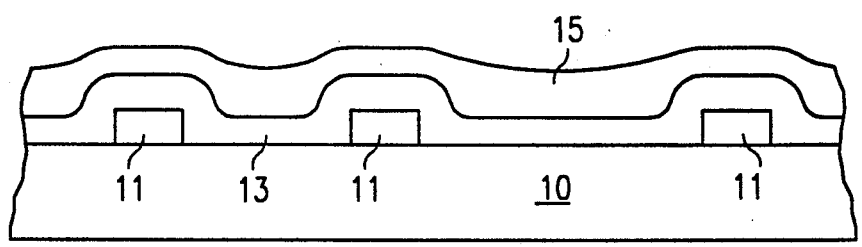
FIGS 1a–1f illustrate side elevation cross-sectional views of a portion of an integrated circuit in various stages of fabrication, in accordance with a preferred embodiment of the method of the invention.

Structures in the various figures of the drawing are not drawn to scale, and the sizes and the dimensions of the various parts illustrated have been exaggerated for clarity of illustration and ease of description. Additionally, in the various figures of the drawing, like reference numerals are used to denote like or similar parts.

DETAILED DESCRIPTION OF THE PREFERRED EMBODIMENTS

It should be noted that the process steps and structures herein described do not necessarily form a complete process flow for manufacturing integrated circuits. It is anticipated that the present invention may be practiced in conjunction with integrated circuit fabrication techniques currently used in the art, and only so much of the commonly practiced process steps are included as are necessary for an understanding of the present invention.

A preferred embodiment of the invention is described herein below beginning with a partially completed integrated circuit structure, as shown in FIG. 1a. The structure is formed on a substrate 10 (which may itself comprise layers of structure stacked one upon the other, such structures being referred to generally as a substrate), and includes metal lines 11 which may be, for example, aluminum or the like, that serve to interconnect various parts of the integrated circuit components (not shown) that have been previously formed on the stack of underlying structure or substrate 10. A layer of oxide 13 is formed over the surfaces of the metal lines 11 and the surface of the substrate 10 between the metal lines 11. The oxide 13 may be formed, for example, in accordance with various techniques presently known in the art, preferably by plasma-enhanced techniques. The oxide layer 13 is conformal with the hills and valleys over which it is formed; consequently, the oxide layer 13 forms mountain regions overlying the metal lines 11 over which it is formed with respect to the valley regions between the metal lines 11.

A layer of spin-on glass 15 is then formed overall. Although spin-on glass has been described and illustrated, the steps of the method of the invention may also be employed with respect to other insulating and/or isolating layers, for example, boron silicate glass or phosphorous silicate glass or the like.

Figure 1B:
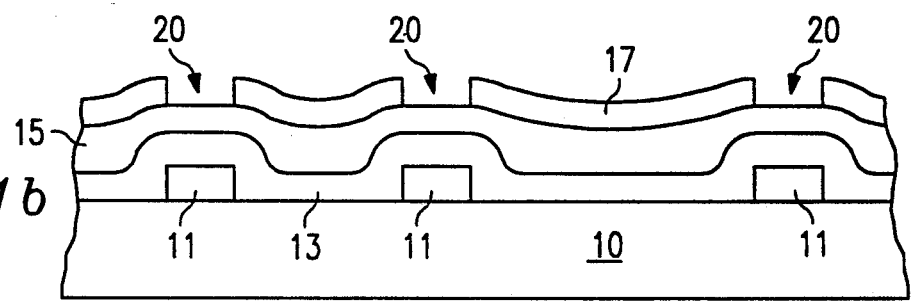

In accordance with the method of the invention, with reference now to FIG. 1b, a layer 17 of photoresist is formed and patterned over the layer of spin-on glass 15. mask, not shown, which may be a reverse or negative mask of the mask used in the formation of the metal lines 11 is used to expose regions 20 of the photoresist layer 17 that overlie the metal lines 11 on the substrate 10. Alternatively, a negative photoresist layer may be used in place of the layer 17 described above, and exposed through the metal mask used in the formation of the metal lines 11, followed by removal of the portions within the regions 20 overlying the metal lines 1; to form the patterned photoresist layer, as shown.

Figure 1C:
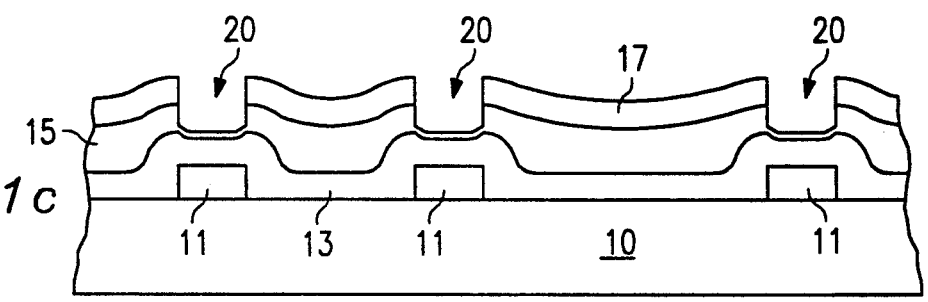

Next, the regions of the spin-on glass 15 and oxide 13 underlying the windows of the photo resist layer 17 are partially etched, as shown in FIG. 1c. The exact depth of the etch will be experimentally determined to achieve a planar final result, described below, and may be, for example, to a depth of between 10% and 90%, preferably between 33% and 66%, of the total depth of the layer 15 and oxide 13 overlying the metal lines 11. The etch process may be any commercially known etch, preferably the dry etch to accomplish the etched structure shown.

Figure 1D:
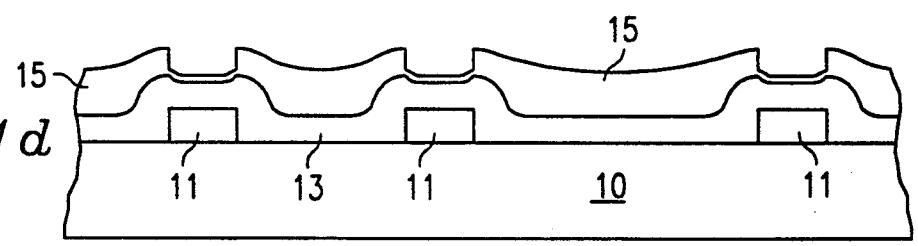
Figure 1E:
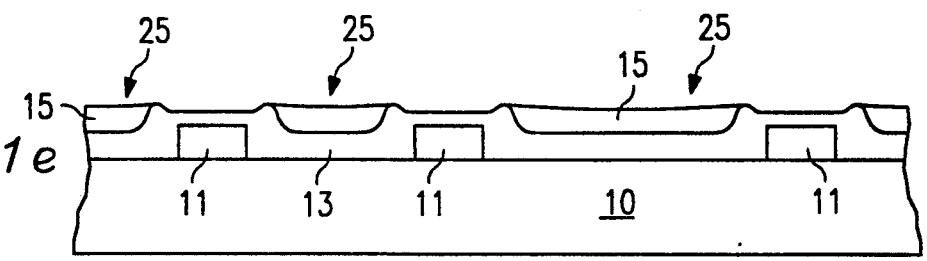
Figure 1F:
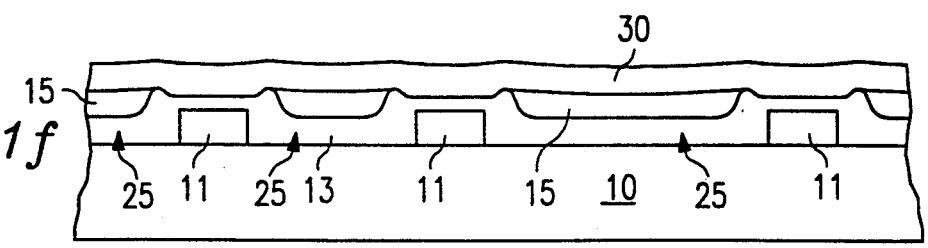

As shown next in FIG. 1d, the layer 17 of photo resist is removed, such as by an ashing process or the like. Finally, as shown in FIG. 1e, the overall structure is exposed to a final planarization etch, which may be, for example, a dry etch, to reduce the thickness of the spin-on glass layer 15 in the regions 25 in the "valley" topography between the metal lines 11. Since the regions overlying the metal lines 11 may have portions of the oxide layer 13 exposed, the etch of the spin-on glass layer 15 in the areas of valley topography will proceed relatively rapidly, but not uncontrollably rapidly. A final integrated circuit structure having a relatively planer surface as shown in FIG. 1e can therefore be accomplished. The integrated circuit structure shown in FIG. 1e can then be further processed in accordance with known integrated circuit technology, for example, for the formation of additional metalization 30 (FIG. 1f), planarization, passivation layers and the like.

Although the invention has been described and illustrated with a certain degree of particularity, it is understood that the present disclosure has been made by way of example only, and that numerous changes in the combination an arrangement of parts and features can be made by those skilled in the art without departing from the spirit and the scope of the invention as hereinafter claimed.

I claim:

1. An integrated circuit structure, comprising:
   a substrate in which integrated circuit elements are constructed;
   a first interconnection metalization formed over said substrate and interconnecting selected ones of said integrated circuit elements;
   a conformal oxide layer formed over said substrate and said first interconnection metalization, said conformal oxide layer having hill regions and valley regions conforming to the topography of the underlying substrate and first interconnection metalization, the hill regions formed into plateau and shoulder regions, the plateau regions positioned above the first interconnection metalization; and a layer of glass at least in valley regions of said oxide layer, to form, in conjection with said conformal oxide layer, a substantially planar surface overall.

2. The integrated circuit structure of claim 1 wherein said conformal oxide layer is a layer of CVD oxide, and said layer of glass is a layer of spin-on glass.

3. The integrated circuit structure of claim 1 further comprising a second interconnection metalization over said conformal oxide layer and said layer of glass.

4. The integrated circuit structure of claim 3 wherein said first and second interconnection metalization are patterned aluminum.

* * * * *